US010502868B2

(12) United States Patent
Trent et al.

(10) Patent No.: US 10,502,868 B2
(45) Date of Patent: Dec. 10, 2019

(54) PHASE GRADIENT NANOCOMPOSITE WINDOW FABRICATION AND METHOD OF FABRICATING DURABLE OPTICAL WINDOWS

(71) Applicant: Raytheon Company, Waltham, MA (US)

(72) Inventors: Catherine Trent, Allen, TX (US); Gary A. Frazier, Garland, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/724,695

(22) Filed: Oct. 4, 2017

(65) Prior Publication Data

US 2018/0093449 A1 Apr. 5, 2018

Related U.S. Application Data

(60) Provisional application No. 62/404,526, filed on Oct. 5, 2016.

(51) Int. Cl.
*B32B 7/02* (2019.01)
*B32B 1/00* (2006.01)
(Continued)

(52) U.S. Cl.
CPC ............... *G02B 1/11* (2013.01); *B29C 41/04* (2013.01); *B32B 1/00* (2013.01); *B32B 5/16* (2013.01); *B32B 7/02* (2013.01); *B82Y 30/00* (2013.01); *C04B 35/01* (2013.01); *C04B 35/053* (2013.01); *C04B 35/505* (2013.01);
(Continued)

(58) Field of Classification Search
CPC ...... G02B 1/11; G02B 5/0221; G02B 5/0294; G02B 1/10; G02B 1/16; C04B 35/505; C04B 35/053; C04B 35/6455; C04B 2235/3206; C04B 2235/3225; C04B 2235/60; C04B 2235/75; C04B 2235/9653; H01Q 1/42; H01Q 15/0013; B29C 41/04; H05K 9/009; B32B 7/02; B32B 1/00; B32B 5/16; B32B 2307/212; B32B 2307/412; B32B 2551/00; F42B 10/46;
(Continued)

(56) References Cited

U.S. PATENT DOCUMENTS 3,383,444 A 5/1968 Loyet
4,072,782 A 2/1978 Kramer et al.
(Continued)

FOREIGN PATENT DOCUMENTS

EP 1520842 A1 4/2005

OTHER PUBLICATIONS

ISR/WO, dated Jan. 15, 2018, RAY0352PCT2, PCT Application No. PCT/US2017/055261, 16 pages.
(Continued)

*Primary Examiner* — David Sample
*Assistant Examiner* — Donald M Flores, Jr.
(74) *Attorney, Agent, or Firm* — Cantor Colburn LLP

(57) ABSTRACT

A unitary radome layer assembly is provided and includes a first nanocomposite formulation and a second nanocomposite formulation. The first and second nanocomposite formulations are provided together in a unitary radome layer with respective distribution gradients.

9 Claims, 7 Drawing Sheets

(51) Int. Cl.

| | |
|---|---|
| *B32B 5/16* | (2006.01) |
| *B29C 41/04* | (2006.01) |
| *G02B 1/11* | (2015.01) |
| *G02B 1/16* | (2015.01) |
| *H05K 9/00* | (2006.01) |
| *B82Y 30/00* | (2011.01) |
| *F42B 10/46* | (2006.01) |
| *G02B 1/10* | (2015.01) |
| *H01Q 1/42* | (2006.01) |
| *H01Q 15/00* | (2006.01) |
| *C04B 35/053* | (2006.01) |
| *C04B 35/645* | (2006.01) |
| *C04B 35/505* | (2006.01) |
| *G02B 5/02* | (2006.01) |
| *C04B 35/01* | (2006.01) |
| *B29L 11/00* | (2006.01) |
| *B29L 31/00* | (2006.01) |

(52) U.S. Cl.
CPC ........ *C04B 35/645* (2013.01); *C04B 35/6455* (2013.01); *F42B 10/46* (2013.01); *G02B 1/10* (2013.01); *G02B 1/16* (2015.01); *G02B 5/0221* (2013.01); *G02B 5/0294* (2013.01); *H01Q 1/42* (2013.01); *H01Q 15/0013* (2013.01); *H05K 9/009* (2013.01); *B29K 2995/0011* (2013.01); *B29K 2995/0026* (2013.01); *B29L 2011/00* (2013.01); *B29L 2031/778* (2013.01); *B32B 2307/212* (2013.01); *B32B 2307/412* (2013.01); *B32B 2551/00* (2013.01); *C04B 2235/3206* (2013.01); *C04B 2235/3225* (2013.01); *C04B 2235/60* (2013.01); *C04B 2235/75* (2013.01); *C04B 2235/9653* (2013.01)

(58) Field of Classification Search
CPC .... B29K 2995/0026; B29K 2995/0011; B29L 2011/00; B29L 2031/778; B82Y 30/00
See application file for complete search history.

(56) References Cited

U.S. PATENT DOCUMENTS

| | | |
|---|---|---|
| 5,102,694 A | 4/1992 | Taylor et al. |
| 5,383,048 A | 1/1995 | Seaver |
| 5,481,400 A | 1/1996 | Borden |
| 5,776,612 A | 7/1998 | Fisher |
| 2002/0050559 A1 | 5/2002 | Mangoubi |
| 2007/0087203 A1 | 4/2007 | Bayya et al. |
| 2008/0013299 A1* | 1/2008 | Renn .................. B41J 2/04 361/818 |
| 2009/0043398 A1 | 2/2009 | Yakimicki et al. |
| 2009/0283720 A1 | 11/2009 | Sweeney et al. |
| 2011/0315808 A1* | 12/2011 | Zelinski ................ B82Y 20/00 244/3.16 |
| 2015/0023643 A1 | 1/2015 | Chartoff et al. |

OTHER PUBLICATIONS

ISR/WO, dated Jan. 15, 2018, RAY0352PCT, PCT Application No. PCT/US2017/055259, 16 pages.

\* cited by examiner

PHASE GRADIENT NANOCOMPOSITE WINDOW FABRICATION AND METHOD OF FABRICATING DURABLE OPTICAL WINDOWS

DOMESTIC BENEFIT/NATIONAL STAGE INFORMATION

The present application is a non-provisional application that claims the benefit of priority to U.S. provisional patent application Ser. No. 62/404,526, which was entitled "PHASE GRADIENT NANOCOMPOSITE WINDOW FABRICATION AND METHOD OF FABRICATING DURABLE OPTICAL WINDOWS", filed on Oct. 5, 2016. The entire contents of U.S. provisional patent application Ser. No. 62/404,526 are incorporated herein by reference.

BACKGROUND

The present disclosure relates to a phase gradient nanocomposite window fabrication method and a method of fabricating durable optical windows.

Optical windows used in aircraft and high-speed missiles must meet very aggressive requirements on flexure strength, impact durability and optical transparency. Often these constraints are in conflict such that environmentally rugged windows lack sufficient transparency or spectral bandwidth for future generation optical search and track applications.

Optical windows can be produced by various processes that include, but are not limited to single crystal growth, chemical vapor deposition (CVD) and nanocomposite sintering. Nanocomposites, in particular, are very attractive materials for use in windows because they can combine multiple materials (or phases) to produce a window that is stronger than the windows produced from either phase alone. Nanocomposite-based windows are generally formed using a powder process which allows very large and curved window shapes to be produced in nearly finished shape. This is called near net shaping and in theory could be used to form windows of any desired shape with minimal waste of materials. Other window materials that employ single crystal growth or CVD require that window fabrication start from a large block of material that is sculpted to produce the desired window topology. This is extremely expensive and time consuming as well as being wasteful in terms of material usage.

When compared to the single phase (e.g., CVD) materials, the nanocomposites have certain disadvantages that weigh against their use despite the benefits of near net shaping. For example, optical transparency of nanocomposite windows may suffer from increased optical absorption and scattering that is introduced by the added material or phase. That is, near net shape sintering of zinc sulfide (ZnS), for example, produces a window that is mechanically weak and not normally usable in airborne applications but, while the second phase of material that is added prevents large grain growth during sintering (a key to maintaining hardness), the added hardening agent introduces scattering and absorption effects. This occurs, in particular, in windows formed of zinc sulfide and in windows including an additional second sulfide phase. Here, while mechanical strength of the window may be dramatically enhanced relative to pure sintered ZnS, the presence of the second sulfide phase can cause strong optical absorption of radiation in a long wave infrared (LWIR) spectral band.

In addition, while certain coatings and electromechanical interference (EMI) treatment layers can be applied to certain windows, such coatings tend to be insufficiently durable. Meanwhile, although mechanical shutters can be used to protect windows in some cases, shutters are not feasible in all cases.

SUMMARY

According to an aspect of the invention, a unitary radome layer assembly is provided and includes a first nanocomposite formulation and a second nanocomposite formulation. The first and second nanocomposite formulations are provided together in a unitary radome layer with respective distribution gradients.

In accordance with additional or alternative embodiments, the respective distribution gradients are defined relative to an axis of the unitary radome layer.

In accordance with additional or alternative embodiments, the respective distribution gradients are defined relative to multiple axes of the unitary radome layer.

In accordance with additional or alternative embodiments, the unitary radome layer has an ogive shape.

In accordance with additional or alternative embodiments, the respective distribution gradients are characterized with an increased distribution of the first nanocomposite formulation remote from a tip of the unitary radome layer with the ogive shape and an increased distribution of the second nanocomposite formulation proximate to the tip of the unitary radome layer with the ogive shape.

In accordance with additional or alternative embodiments, the first nanocomposite formulation includes particles of first sizes, the second nanocomposite formulation includes particles of second sizes, the second sizes being generally larger than the first sizes and the respective distribution gradients are characterized with an increased distribution of the particles of the first sizes remote from a tip of the unitary radome layer with the ogive shape and an increased distribution of the particles of the second sizes proximate to the tip of the unitary radome layer with the ogive shape.

In accordance with additional or alternative embodiments, the unitary radome layer has at least one of an ogive shape, a rounded shape and a flattened shape.

According to another aspect of the invention, a unitary radome layer assembly method is provided and includes designing a unitary radome layer with first and second portions, the first portions being more durable than the second portions and the second portions being more optically transparent than the first portions, providing first and second nanocomposite formulations together in a unitary radome layer mold, the second nanocomposite formulation having a hardener and a higher effective density than the first nanocomposite formulation and generating respective distribution gradients for the first and second nanocomposite formulations prior to curing.

In accordance with additional or alternative embodiments, the generating of the respective distribution gradients includes defining the respective distribution gradients relative to a unitary radome layer axis, placing the unitary radome layer mold with the first and second nanocomposite formulations in a centrifuge and activating the centrifuge to rotate the unitary radome layer mold with the first and second nanocomposite formulations about the unitary radome layer axis.

In accordance with additional or alternative embodiments, the generating of the respective distribution gradients includes defining the respective distribution gradients relative to multiple unitary radome layer axes, placing the unitary radome layer mold with the first and second nanocomposite formulations in a centrifuge and activating the centrifuge to rotate the unitary radome layer mold with the first and second nanocomposite formulations about the multiple unitary radome layer axes.

In accordance with additional or alternative embodiments, the designing includes designing the unitary radome layer to have at least one of an ogive shape, a rounded shape and a flattened shape.

In accordance with additional or alternative embodiments, the method further includes controlling undesirable separation parameters of the first and second nanocomposite formulations.

In accordance with additional or alternative embodiments, the controlling of the undesirable separation parameters includes ultrasonic assist processes.

In accordance with additional or alternative embodiments, the method further includes adding materials to at least one of the first and second nanocomposite formulations to adjust at least one of respective effective densities and respective sedimentation rates thereof.

According to yet another aspect of the invention, a unitary radome layer assembly method is provided and includes designing an ogive shaped unitary radome layer comprising a tip and with first and second portions, the first portions being disposed proximate to the tip and being more durable than the second portions and the second portions being disposed remotely from the tip and being more optically transparent than the first portions, providing first and second nanocomposite formulations together in a unitary radome layer mold having an ogive shape, the second nanocomposite formulation having a hardener and a higher effective density than the first nanocomposite formulation and generating respective distribution gradients for the first and second nanocomposite formulations relative to an axis of the ogive shape prior to curing.

In accordance with additional or alternative embodiments, the generating of the respective distribution gradients includes defining the respective distribution gradients relative to a lateral axis of the unitary radome layer which is transversely oriented relative to a central longitudinal axis thereof, placing the unitary radome layer mold with the first and second nanocomposite formulations in a centrifuge and activating the centrifuge to rotate the unitary radome layer mold with the first and second nanocomposite formulations about the lateral axis.

In accordance with additional or alternative embodiments, the generating of the respective distribution gradients includes defining the respective distribution gradients relative to the lateral axis and an additional axis and activating the centrifuge to rotate the unitary radome layer mold with the first and second nanocomposite formulations about the lateral axis and the additional axis.

In accordance with additional or alternative embodiments, the method further includes controlling undesirable separation parameters of the first and second nanocomposite formulations.

In accordance with additional or alternative embodiments, the controlling of the undesirable separation parameters includes an ultrasonic assist process.

In accordance with additional or alternative embodiments, the method further includes adding materials to at least one of the first and second nanocomposite formulations to adjust at least one of respective effective densities and respective sedimentation rates thereof.

These and other advantages and features will become more apparent from the following description taken in conjunction with the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be discussed below, potentially quite large and curved optical widows with excellent long-wave and mid-wave broadband transparency and high mechanical durability are provided. The windows are made of very durable nanocomposite materials with high optical transparency and are formed based upon the fact that optical transparency is required of the entire bulk of the window while durability is only required at the surface of the material that is exposed to environmental effects. A centrifuge is used to increase the density of the hardening agent near the outer surface of the windows to increase mechanical strength where it is most needed while reducing or eliminating the hardening agent in other areas of the window bulk. By maintaining less total volume of hardener, the optical transparency of the window as a whole is relatively improved. Meanwhile, by increasing the density of the hardener at the surface of the window, mechanical durability is improved. The resulting optical and mechanical performance of the "phase gradient" nanocomposite window will exceed that of the current technology and even allow new hardening agents to be introduced without strongly or adversely affecting optical transparency. The use of centrifugal force generated by the centrifuge allows less optically absorbing material to be used in the nanocomposite formulation while actually increasing the mechanical strength of the window and its durability against rain, sand and other impacts. Ultrasonic agitation may be added as a method for performing dry powder centrifugal sedimentation.

Figure 1:
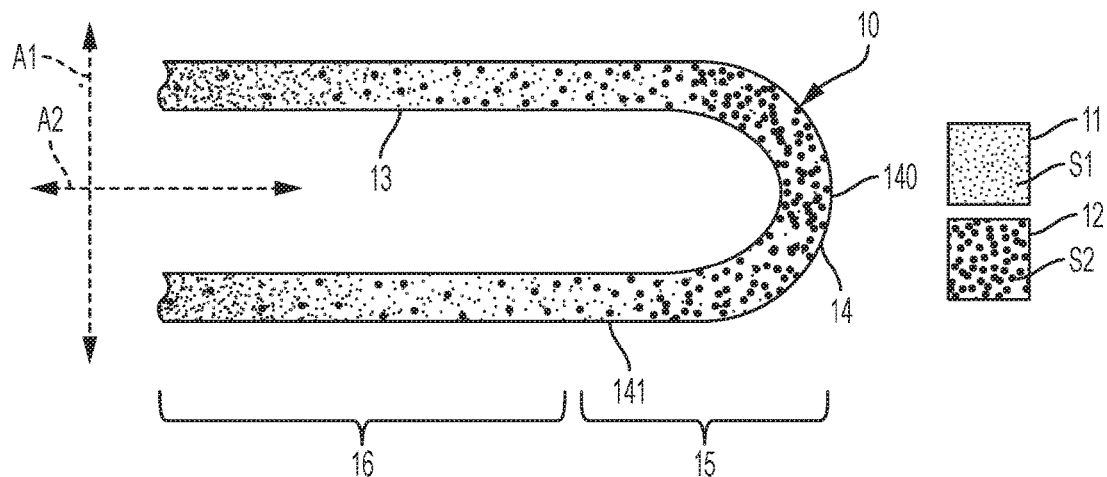
FIG. 1 is a side view of a unitary radome layer in accordance with embodiments.

With reference to FIG. 1, a unitary radome layer assembly 10 is provided and includes a first nanocomposite formulation 11 and a second nanocomposite formulation 12. The second nano-composite formulation 12 has a hardener and a higher effective density than the first nanocomposite formulation 11. The first nano-composite formulation 11 may be but need not be more optically transparent than the second composite nano-formulation 12 due at least in part to the lack of the hardener in the first nano-composite formulation. The first and second nanocomposite formulations 11 and 12 are provided together in a unitary radome layer 13 with each having a respective distribution gradient defined relative to an axis or to multiple axes of the unitary radome layer 13.

In accordance with embodiments and, as shown in FIG. 1, the unitary radome layer 13 may be provided with a nose cone or ogive shape 14 that has a pointed nose cone or ogive tip 140 and curved sidewalls 141 extending in the aft direction from the pointed nose cone or ogive tip 140. In these and other cases, the respective distribution gradients of the first and second nano-composite formulations 11 and 12 are defined relative to a lateral axis A1 of the unitary radome layer 13 which is oriented transversely or perpendicularly with respect to a central longitudinal axis A2 of the unitary radome layer 13. That is, the lateral axis A1 may effectively define a first, front or forward portion 15 of the unitary radome layer 13 as being any part of the unitary radome layer 13 that is proximate to the nose cone or ogive tip 140 and a second, rear or aft portion 16 of the unitary radome layer 13 as being any part of the unitary radome layer 13 that is remote from the nose cone or ogive tip 140.

To the extent that the second nanocompo site formulation 12 has the hardener and a higher effective density than the first nano-composite formulation 11, the unitary radome layer 13 can be formed and cured (e.g., sintered) such that the distribution gradient of the second nano-composite formulation 12 is characterized in that most of the second nano-composite formulation 12 is located in the forward portion 15 and such that the distribution gradient of the first nano-composite formulation 11 is characterized such that most of the first nano-composite formulation 11 is located in the aft portion 16. These characterizations of the respective gradients have the following results.

With the first and second nano-composite formulations 11 and 12 generally being located in the aft and forward portions 16 and 15, respectively, homogeneity within the forward and aft portions 15 and 16 is increased and a tendency of the unitary radome layer 13 to scatter or absorb electro-magnetic (EM) radiation is correspondingly reduced as compared to what would otherwise occur if the first and second nano-composite formulations 11 and 12 were distributed evenly throughout the unitary radome layer 13.

In addition, with the second nano-composite formulation 12 with the hardener being relatively harder than the first nano-composite formulation 11 and being generally or mostly located in the forward portion 15 where the unitary radome layer 13 is most likely to experience impacts with foreign objects and where optical transmission of signals through the unitary radome layer 13 is generally less important, an overall strength and durability of the unitary radome layer 13 is enhanced without sacrificing useful optical transparency. Meanwhile, with the first nano-composite formulation 11 being relatively more optically transparent than the second nano-composite formulation 12 and being generally or mostly located in the aft portion 16 where optical transmission of signals through the unitary radome layer 13 is most important and where impacts are generally less common, an overall optical transparency of the unitary radome layer 13 is enhanced without sacrificing strength or durability.

Figure 2:
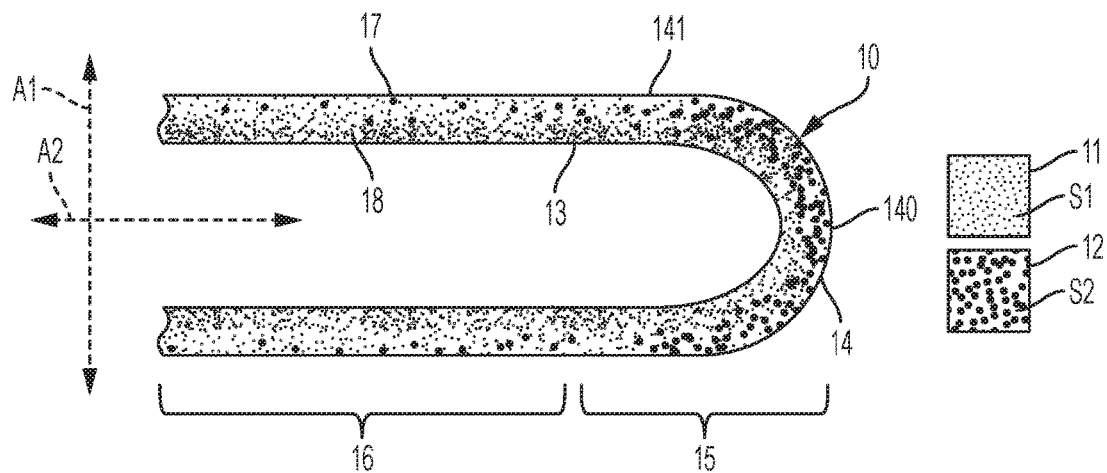
FIG. 2 is a side view of a unitary radome layer in accordance with further embodiments.

With reference to FIG. 2 and in accordance with further embodiments, the unitary radome layer 13 may be provided with the nose cone or ogive shape 14 as in FIG. 1 but with the respective distribution gradients of the first and second nano-composite formulations 11 and 12 defined relative to multiple axes of the unitary radome layer 13. In these or other cases, the multiple axes may include for example the lateral axis A1 and the central longitudinal axis A2. That is, while the lateral axis A1 may effectively define the forward and aft portions 15 and 16 of the unitary radome layer 13, the central longitudinal axis A2 may define outer portions 17 of the unitary radome layer 13 as being those parts of the unitary radome layer 13 that are proximate to outer surfaces of the nose cone or ogive tip 140 and the sidewalls 141 and inner portions 18 of the unitary radome layer 13 as being those parts of the unitary radome layer 13 that are proximate to interior surfaces of the nose cone or ogive tip 140 and the sidewalls 141.

In the embodiments of FIG. 2, the unitary radome layer 13 can be formed and cured (e.g., sintered) such that the distribution gradient of the second nano-composite formulation 12 is characterized in that most of the second nano-composite formulation 12 is located along the outer portions 17 in the forward portion 15 and such that the distribution gradient of the first nano-composite formulation 11 is characterized such that most of the first nano-composite formulation 11 is located along the inner portions 18 in the aft portion 16.

In accordance with still further embodiments, the first nanocomposite formulation 11 may include yttrium oxide ($Y_2O_3$) particles of relatively small or first sizes (e.g., as measured in terms of mean or average individual particle diameters) S1 and the second nanocomposite formulation 12 may include magnesium oxide (MgO) particles of relatively large or second sizes (e.g., as measured again in terms of mean or average individual particle diameters) S2 where the second sizes S2 are generally larger than the first sizes S1. Thus, in the case of the embodiments of FIG. 1, the respective distribution gradients are characterized with an increased distribution of the $Y_2O_3$ particles of the first sizes S1 remote from the nose cone or ogive tip 140 in the aft portion 16 and an increased distribution of the MgO particles of the second sizes S2 proximate to the nose cone or ogive tip 140 in the forward portion 15. In the case of the embodiments of FIG. 2, the respective distribution gradients are characterized with an increased distribution of the $Y_2O_3$ particles of the first sizes S1 remote from the nose cone or ogive tip 140 and along the inner portions 18 in the aft portion 16 and an increased distribution of the MgO particles of the second sizes S2 proximate to the nose cone or ogive tip 140 and along the outer portions 17 in the forward portion 15.

Figure 3:
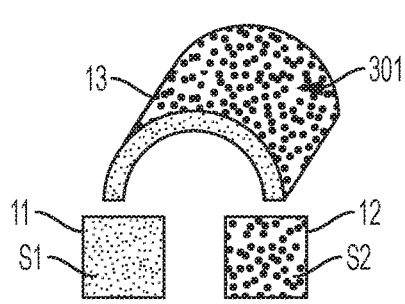
FIG. 3 is a perspective view of a unitary radome layer in accordance with alternative embodiments.
Figure 4:
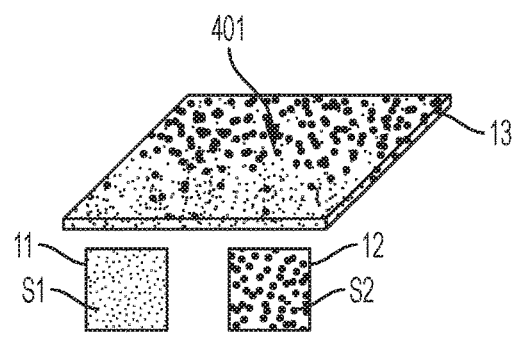
FIG. 4 is a perspective view of a unitary radome layer in accordance with alternative embodiments.

With reference to FIGS. 3 and 4 and in accordance with embodiments, the unitary radome layer 13 may have at least one of a rounded (e.g., spherical, hemispherical, etc.) shape 301 (see FIG. 3) and a flattened shape 401 (see FIG. 4). In either or other cases, the unitary radome layer 13 may include the first and second nano-composite formulations 11 and 12, as noted above, with the respective distribution gradients. Thus, in exemplary cases, the unitary radome layer 13 with the rounded shape 301 of FIG. 3 may have an increased distribution of the first nano-composite formulation 11 toward the interior surface of the curvature and an increased distribution of the second nano-composite formulation 12 toward the exterior surface of the curvature. Similarly, the unitary radome layer 13 with the flattened shape 401 of FIG. 4 may have an increased distribution of the first nano-composite formulation 11 toward one side thereof and an increased distribution of the second nano-composite formulation 12 toward the other side thereof.

Figure 5:
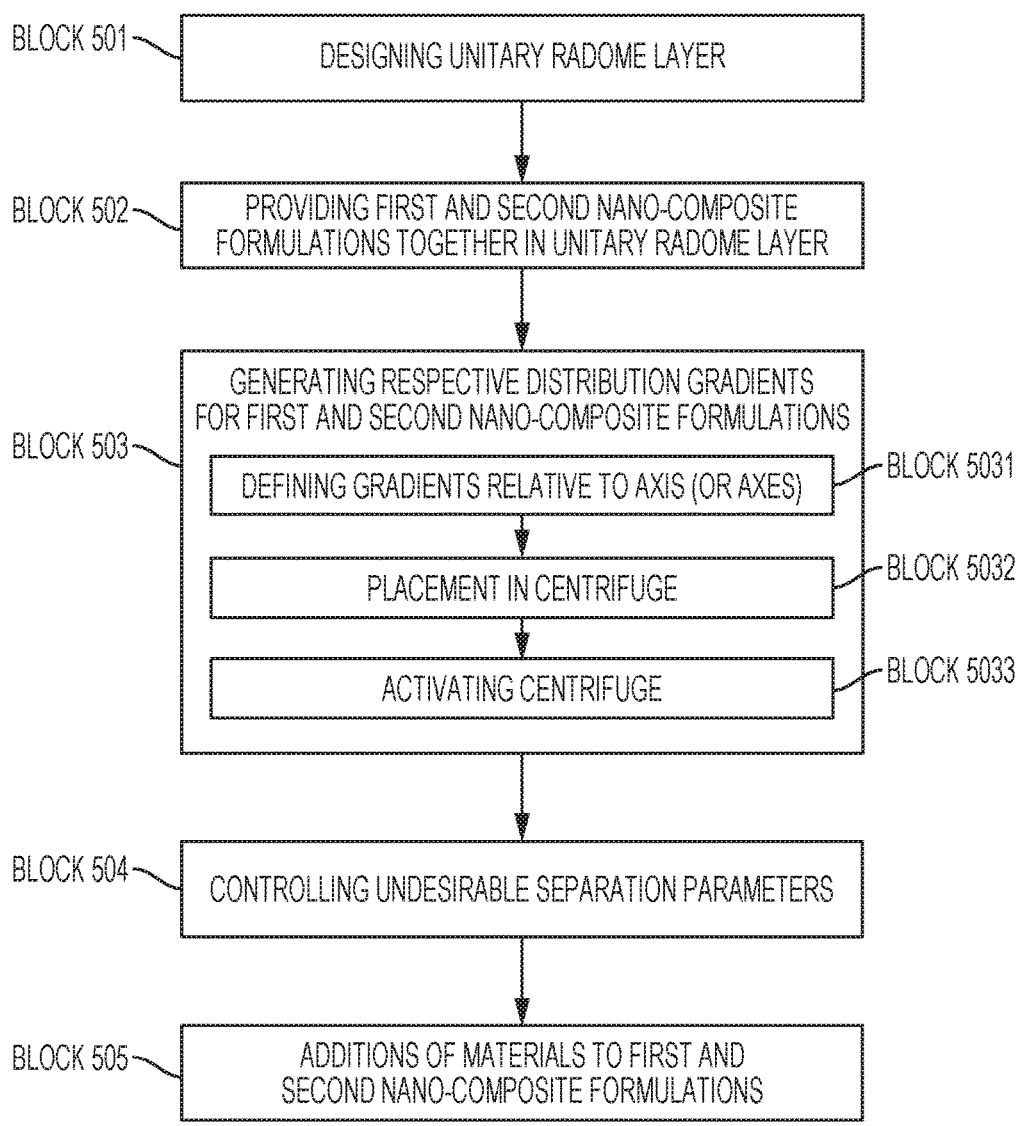
FIG. 5 is a flow diagram illustrating a unitary radome layer assembly method in accordance with embodiments.

With reference to FIG. 5, a unitary radome layer assembly method is provided. The method initially includes designing a unitary radome layer with first and second portions (such as the unitary radome layer 13 with the nose cone or ogive shape 14 and the first, front or forward portions 15 and the second, rear or aft portions 16 of FIGS. 1 and 2, the unitary radome layer 13 with the rounded shape 301 of FIG. 3 or the unitary radome layer 13 with the flattened shape 401 of FIG. 4) such that the first portions are more durable than the second portions and such that the second portions are more optically transparent than the first portions (block 501). The method further includes providing first and second nano-composite formulations together in a unitary radome layer mold (such as a mold with a nose cone or ogive shape as in FIGS. 1 and 2) where the second nanocomposite formulation has a hardener and a higher effective density than the first nanocomposite formulation (block 502). The method then includes an operation of generating respective distribution gradients for the first and second nanocomposite formulations prior to curing (e.g., sintering) (block 503).

In accordance with further embodiments and as shown in FIG. 5, the method may also include controlling undesirable separation parameters of the first and second nanocomposite formulations (block 504) and an addition of materials to at least one of the first and second nanocomposite formulations to adjust at least one of respective effective densities and respective sedimentation rates thereof (block 505). The controlling of the undesirable separation parameters of block 504 may include, for example, an ultrasonic assist process executed with respect to the first and/or the second nanocomposite formulations.

The first and second formulations may be suspended in fluid or provided as dry powders. In the latter case, it is to be understood that the dry powders may not be easily separated using centrifugal force. Here, an ultrasonic agitator can be attached to the centrifuge to ultrasonically assist separation and dispersion processes. The ultrasonic agitation disrupts attractive van der Walls forces between the particles of the first and second formulations to allow them to more easily migrate or glide through the volume. Also, since the hardener of the second nano-composite formulation can tend to lower the effective density of the second nano-composite formulation, a third phase or material that may be optically benign can be added to the second nano-composite formulation to increase the effective density of the second nano-composite formulation beyond that of the first nano-composite formulation.

In accordance with embodiments, the generating of the respective distribution gradients of block 503 may include defining the respective distribution gradients relative to a unitary radome layer axis, such as the lateral axis A1 of FIGS. 1 and 2, or to multiple unitary radome layer axes, such as the lateral axis A1 and the central longitudinal axis A2 of FIGS. 1 and 2 (block 5031). In addition, the generating of the respective distribution gradients of block 503 may further include placing the unitary radome layer mold with the first and second nanocomposite formulations in a centrifuge (block 5032) and activating the centrifuge to rotate the unitary radome layer mold with the first and second nanocomposite formulations about the unitary radome layer axis or about the multiple unitary radome layer axes (block 5033).

Figure 6:
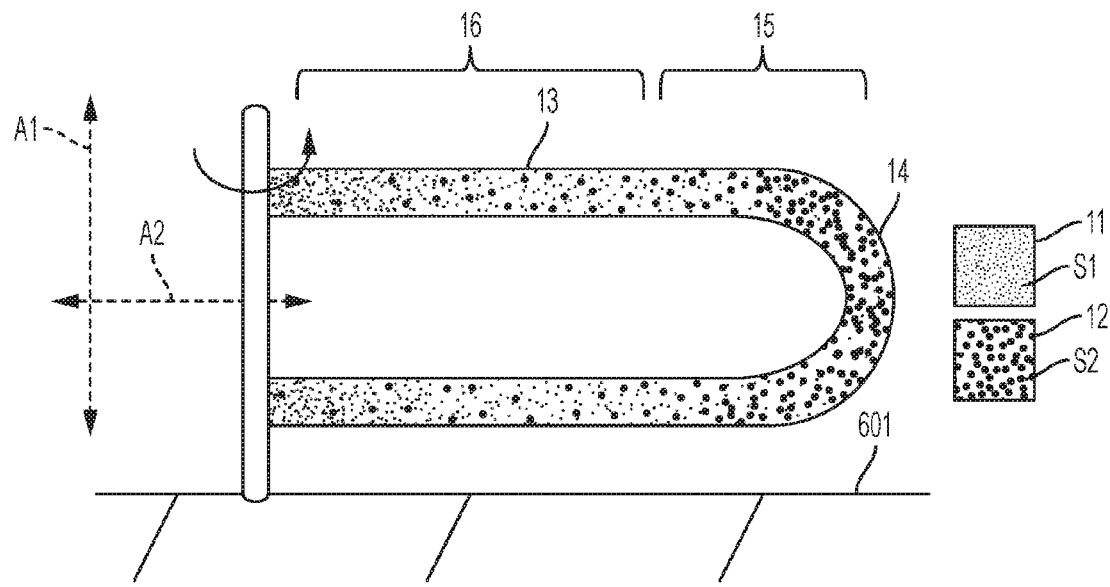
FIG. 6 is a schematic illustration of a centrifuge used to generate a distribution gradient in a unitary radome layer prior to curing or sintering in accordance with embodiments.

With reference to FIG. 6, the generating of the respective distribution gradients of block 503 is illustrated for the case of the unitary radome layer 13 having the nose cone or ogive shape 14 and the respective distribution gradients being defined relative to the lateral axis A1. In this case, the unitary radome layer 13 is coupled to a centrifuge 601 prior to curing of the curable material and the centrifuge 601 is activated to rotate the unitary radome layer 13 about the lateral axis A1. Such rotation produces centrifugal forces that are applied to the first and second nano-composite formulations 11 and 12 that result in the generation of an artificial gravitational field. Within this artificial gravitational field, the first and second nano-composite formulations 11 and 12 segregate from one another due to the second nano-composite formulation 12 having the higher effective density such that the second nano-composite formulation 12 pools at the forward portion 15 and the first nano-composite formulation 11 pools at the aft portion 16.

Figure 7:
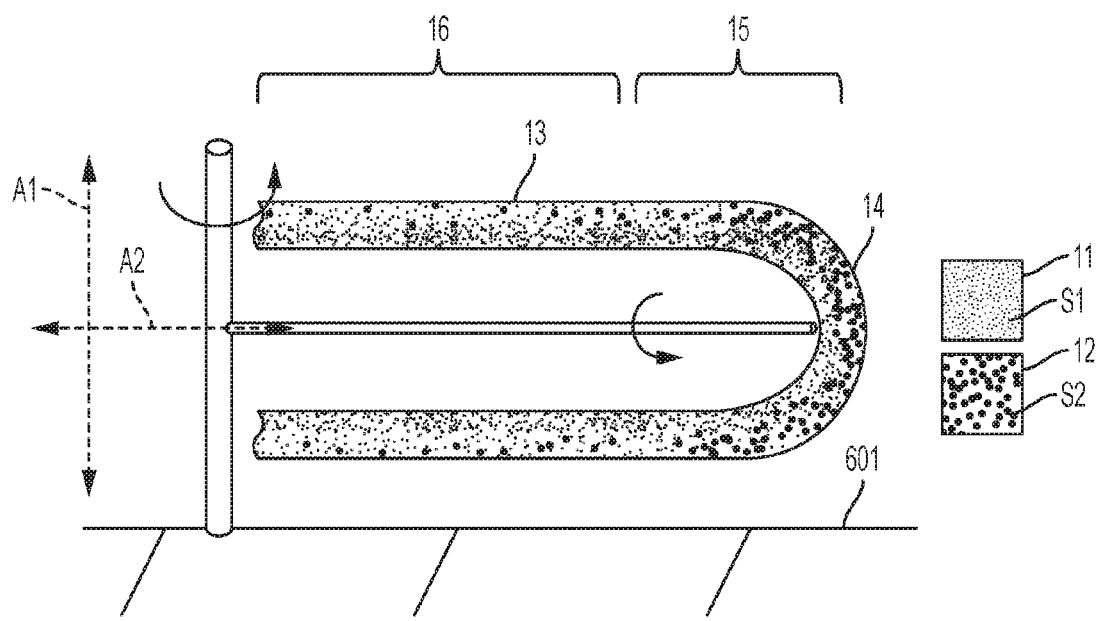
FIG. 7 is a schematic illustration of a centrifuge used to generate a distribution gradient in a unitary radome layer prior to curing or sintering in accordance with further embodiments.

With reference to FIG. 7, in an event the centrifuge 601 of FIG. 6 were modified to rotate the unitary radome layer 13 about the central longitudinal axis A2 or in an event the unitary radome layer 13 were placed into a new centrifuge, rotation of the unitary radome layer 13 about the central longitudinal axis A2 prior to curing can lead to a further pooling of the second nano-composite formulation 12 along the outer portions 17 in the forward portion 15 and a further pooling of the first nano-composite formulation 11 along the inner portions 18 in the aft portion 16.

It is to be understood that the invention described herein can be employed jointly with EMI protection as explained below with reference to FIGS. 8-15.

As will be discussed below, a durable optical window is provided for use in LWIR applications for example. A standard optical window with a core layer formed of zinc sulfide (ZnS) is augmented with a nanocomposite optical ceramic (NCOC) cladding layer. Both the core and the cladding may be formed using NCOC powder-process sintering/HIPing processes. The cladding is generally only thick enough to meet strength/impact goals while the bulk of the window is formed of the highly transparent ZnS. In addition, an electromagnetic interference (EMI) treatment layer is interposed between the two core and cladding layers to provide EMI protection. The EMI treatment layer may be a deposited films or a microtextured (moth eye) grid on one or more surfaces. The durable optical window may also include anti-reflection and adhesive layers.

Figure 8:
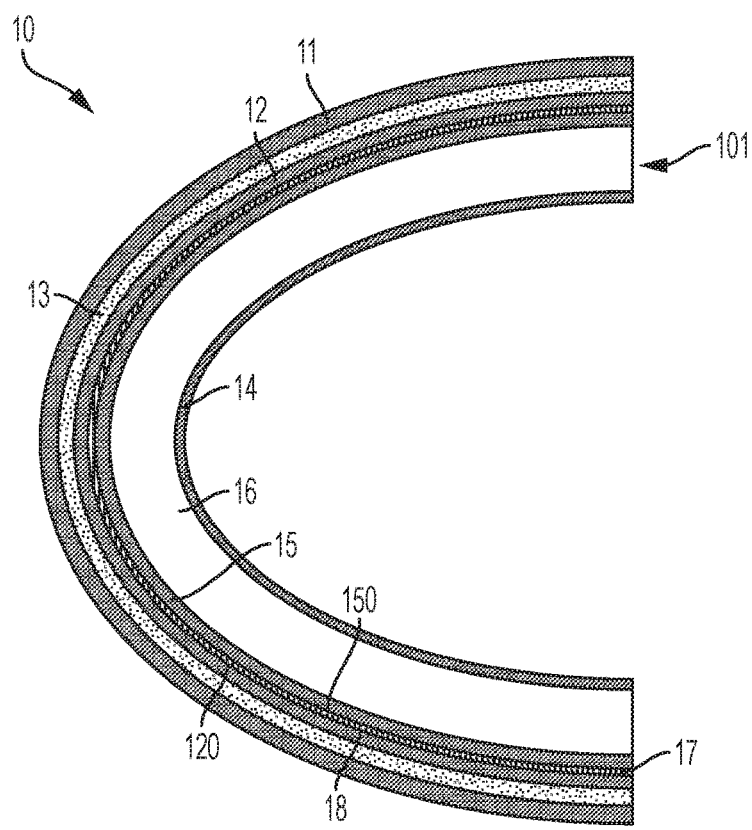
FIG. 8 shows a side view of an optical window in accordance with embodiments.

With reference to FIG. 8, an optical window 10 is provided and includes multiple anti-reflection coatings between which additional layers are interleaved. In detail, the optical window 10 includes an outermost anti-reflection coating 11, an outer-intermediate anti-reflection coating 12, a cladding or outermost window layer (hereinafter referred to as an "outermost window layer") 13 that is interleaved between the outermost anti-reflection coating 11 and the outer-intermediate anti-reflection coating 12, an innermost anti-reflection coating 14, an inner-intermediate anti-reflection coating 15, a core or innermost window layer (hereinafter referred to as an "innermost window layer") 16 that is interleaved between the innermost anti-reflection coating 14 and the inner-intermediate anti-reflection coating 15 and an EMI treatment layer 17.

The EMI treatment layer 17 is located or interleaved between the outer-intermediate anti-reflection coating 12 and the inner-intermediate anti-reflection coating 15. The EMI treatment layer 17 serves to provide for EMI protection for the optical window 10. In its position interleaved between the innermost anti-reflection coating 14 and the inner-intermediate anti-reflection coating 15, the EMI treatment layer 17 is protected from external and/or environmental conditions for which exterior EMI layers are not normally suitable.

The optical window 10 may further include an adhesive layer 18. Such an adhesive layer 18 may be disposed adjacent to the EMI treatment layer 17 and may include at least one or more of polyethylene, polystyrene, polypropylene, low melting temperature glasses, a thiol and a urethane.

As shown in FIG. 8, the optical window 10 and the various components and layers thereof may have a curved shape 101. More particularly, the optical window 10 and the various components and layers thereof may have a nose-cone shape for provision at a forward end of an aircraft or a missile.

In accordance with embodiments, the outermost window layer 13 may include nanocomposite optical ceramic (NCOC) material and, in some cases, may include multiple NCOC materials and possibly hardening materials with one or more gradients defined therein. Meanwhile, the innermost window layer 16 may include a single phase material, such as quartz or zinc sulfide (ZnS). In any case, the outermost window layer 13 may be harder or substantially harder than the innermost window layer 16 (e.g., the outermost window layer 13 may be up to 5 or more times harder than the innermost window layer 16). The innermost window layer 16 may be thicker or substantially thicker than the outermost window layer 13.

Figure 9:
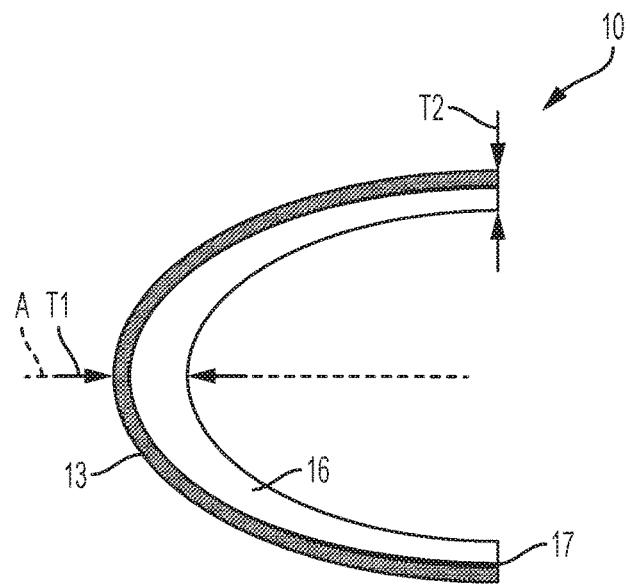
FIG. 9 shows a side view of a simplified version of the optical window in accordance with further embodiments.

With reference to FIG. 9, which includes some but not all the features of FIG. 8 for purposes of clarity, a thickness of the optical window 20 may be variable at various locations where the optical window 10 and the various components and layers thereof have a curved or nose-cone shape. For example, in the case of the optical window 10 having the nose-cone shape, the optical window 10 may have a maximum thickness T1 along a central longitudinal axis A thereof a lesser thickness T2 at terminal side edges thereof and a decreasing thickness with increasing radial distance from the central longitudinal axis A. In addition, as shown in FIG. 9, the innermost window layer 16 may be thicker than the outermost window layer 13 along the central longitudinal axis A and at the terminal side edges. Moreover, while the outermost window layer 13 and the innermost window layer 16 both may exhibit decreasing thicknesses with increasing radial distance from the central longitudinal axis, the degree of the decrease may be more pronounced in the innermost window layer 16.

With continued reference to FIG. 8 and with additional reference to FIGS. 10 and 11, certain features of the EMI treatment layer 17 will now be described. As shown in FIG. 8, the EMI treatment layer 17 is interposed between the outermost surface 150 of the inner-intermediate anti-reflection coating 15 and either an innermost surface 120 of the outer-intermediate anti-reflection coating 12 or an innermost surface (not shown) of the adhesive layer 18. The EMI treatment layer 17 may be substantially thinner than the outermost window layer 13 and, in some cases, the innermost window layer 16 as well. The EMI treatment layer 17 may exhibit greater losses as compared to either the outermost window layer 13 or the innermost window layer 16 but, since a thickness of the EMI treatment layer 17 is relatively small, such losses can be limited. In any case, the EMI treatment layer 17 may include or be formed as at least one of a conductive grid 170 (see FIG. 10) and a conductive film 171 (see FIG. 11).

Figure 10:
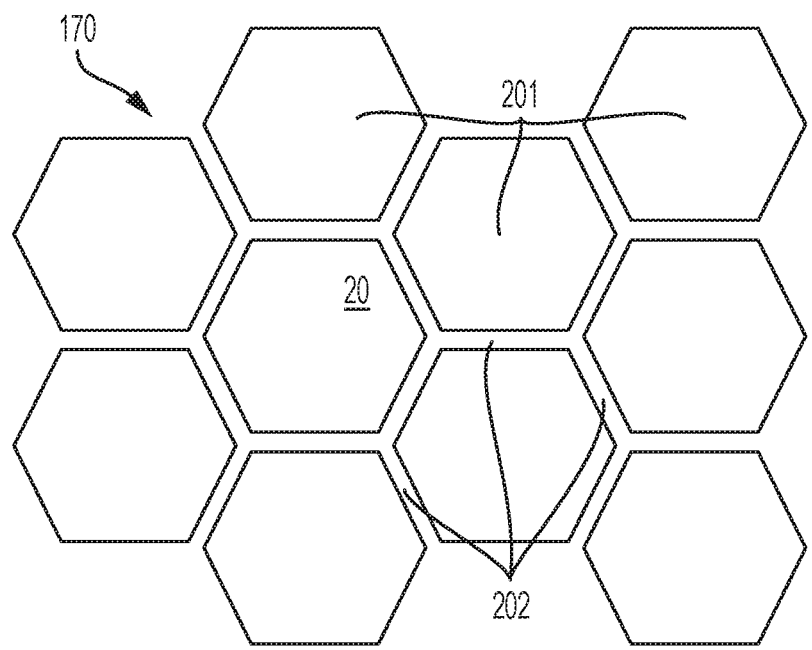
FIG. 10 shows an EMI treatment layer of the optical windows of FIGS. 8 and 9 in accordance with alternative embodiments.
Figure 11:
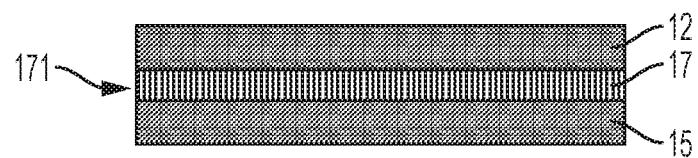
FIG. 11 shows an EMI treatment layer of the optical windows of FIGS. 8 and 9 in accordance with alternative embodiments.

In the case of the EMI treatment layer 17 being provided as a conductive grid 170 as in FIG. 10, the outermost surface 150 of the inner-intermediate anti-reflection coating 15 may be micro-textured (e.g., as at least one of a deposited geometric optic coating pattern and a micro-textured physical optic coating pattern) to form grooves in which the material of the EMI treatment layer 17 can sit. For example, the conductive grid 170 can be formed with a moth-eye pattern 20 where the outermost surface 150 (see FIG. 8) includes an array of raised hexagonal protrusions 201 that are separated from one another by inter-protrusion grooves 202. During processing of the optical window 10, materials of the EMI treatment layer 17 are disposed or deposited within these inter-protrusion grooves 202 and subsequently cured therein to form the EMI treatment layer 17.

Figure 12:
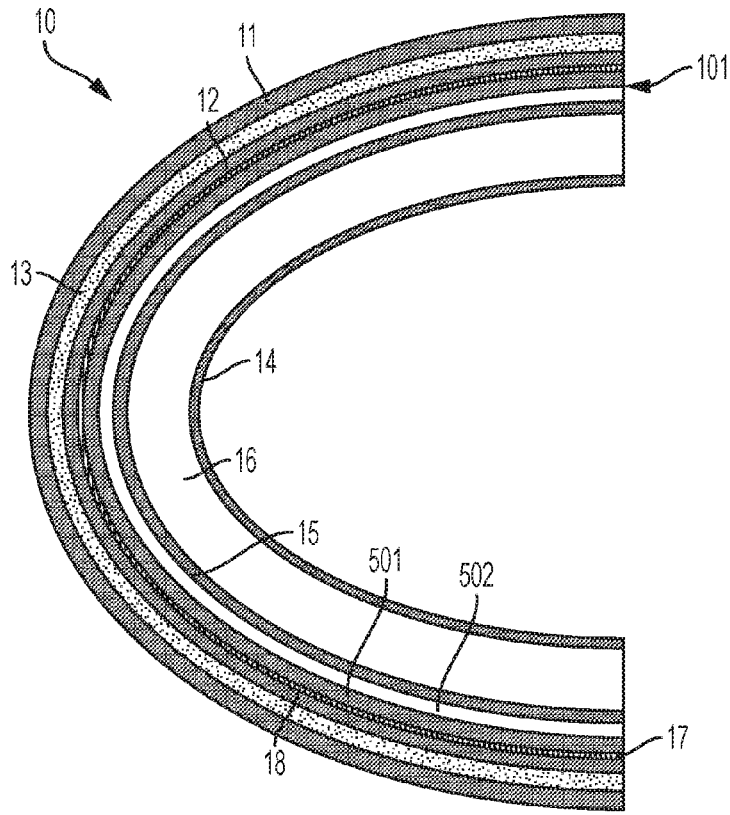
FIG. 12 shows a side view of an optical window with a thermal management space in accordance with embodiments.

With reference to FIG. 12 and in accordance with further embodiments, an additional anti-reflective coating 501 may be interposed between the innermost anti-reflection coating 14 and the inner-intermediate anti-reflection coating 15. This additional anti-reflection coating 501 may also be displaced from the inner-intermediate anti-reflection coating 15 to define a thermal management space 502 there between. In operational conditions, this thermal management space 502 may be supplied with coolant, such as air flow or fluid, or a heating element, such as an electrically resistive element, to maintain an appropriate operating temperature of the optical window 10.

Figure 13:
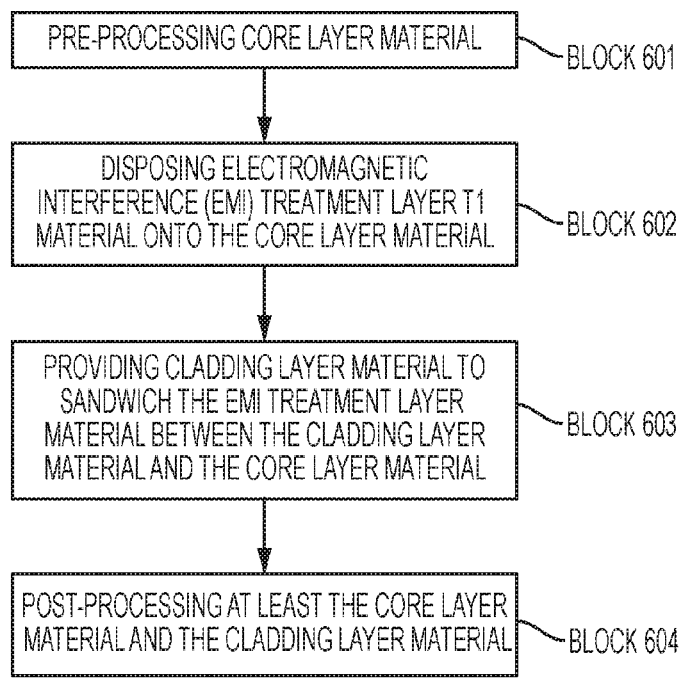
FIG. 13 is a flow diagram illustrating a method of assembling an optical window in accordance with embodiments.

With reference to FIG. 13, a method of assembling an optical window, such as the optical window 10 with the curved shape as described herein, is provided. As shown in FIG. 13, the method includes pre-processing core layer material (block 601), disposing electromagnetic interference (EMI) treatment layer material onto the core layer material (block 602), providing cladding layer material to sandwich the EMI treatment layer material between the cladding layer material and the core layer material (block 603) and post-processing at least the core layer material and the cladding layer material (block 604). As noted above, the cladding layer material may include a nanocomposite optical ceramic (NCOC) and, in some cases, may include multiple NCOC materials and possibly hardening materials with one or more gradients defined therein, and the core layer material may include a single phase material such as zinc sulfide (ZnS).

In accordance with embodiments, the pre-processing of the core layer material and the cladding layer material of block 601 and 603 may include at least one or more of sintering and hot isostatic pressurizing (HIPing). Similarly, the post-processing of at least the core layer material and the cladding layer material of block 604 may include at least one or more of sintering and HIPing.

Figure 14:
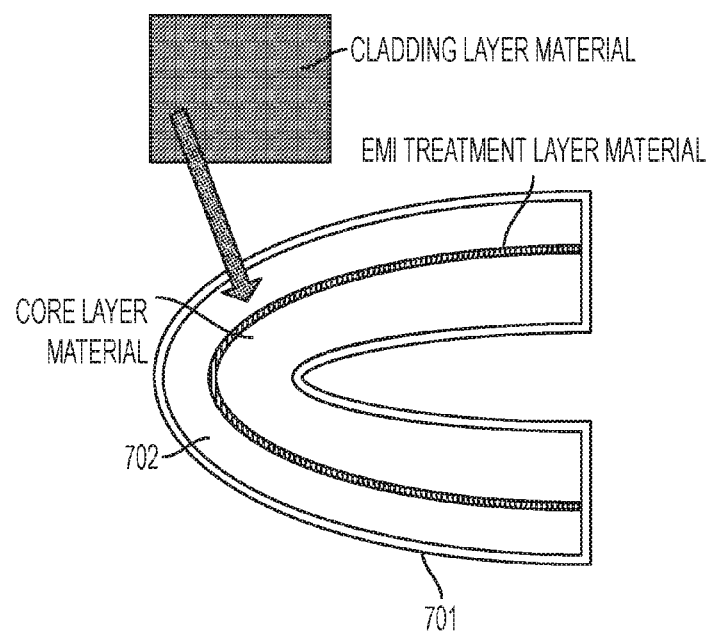
FIG. 14 is a schematic illustration of a fixture for providing an optical window with a cladding layer in accordance with embodiments.

With reference to FIG. 14 and in accordance with embodiments, the providing of the cladding layer material of block 603 may include placing pre-processed core layer material and EMI treatment layer material in a fixture 701 that is formed to set a cladding layer thickness and subsequently depositing the cladding layer material into the space 702 in the fixture 701 between the pre-processed core layer material and the EMI treatment layer material.

Figure 15:
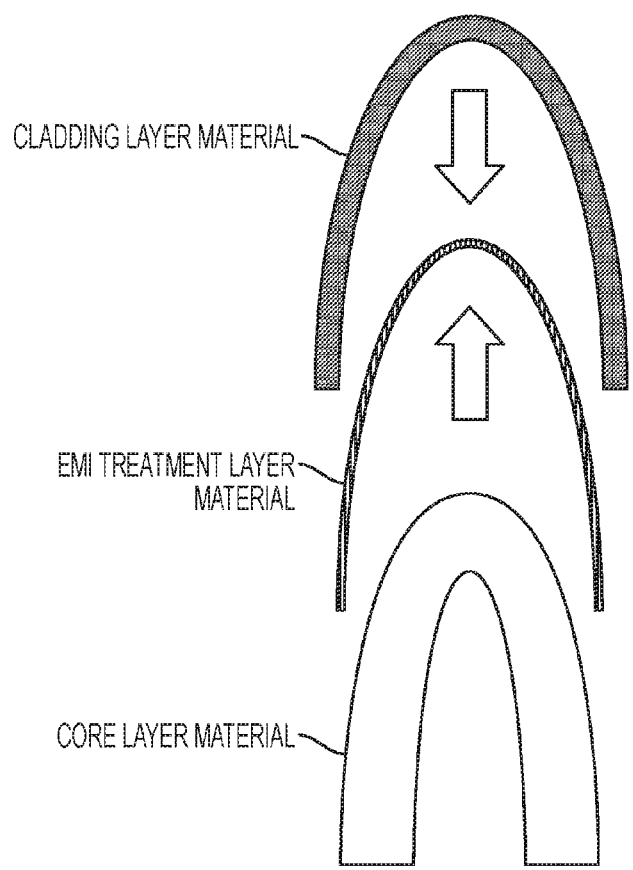
FIG. 15 is a schematic illustration of a method of sandwiching an EMI treatment layer between core and cladding layers of an optical window in accordance with embodiments.

With reference to FIG. 15 and in accordance with alternative embodiments, the providing of the cladding layer material of block 603 may include pre-processing both the core layer material and the cladding layer material, sandwiching the EMI treatment layer material between the core and cladding layer materials and at least one or more of sintering and HIPing the various layers together.

It is to be understood that the invention described herein can be employed jointly with a phase gradient nanocomposite layer.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A unitary radome layer assembly, comprising:
    a first nanocomposite formulation; and
    a second nanocomposite formulation,
    the first and second nanocomposite formulations being provided together in a unitary radome layer with respective distribution gradients defined in terms of distance from an aft-to-forward axis and about a central longitudinal axis which is perpendicular to the aft-to-forward axis.

2. The unitary radome layer assembly according to claim 1, wherein the unitary radome layer has an ogive shape.

3. The unitary radome layer assembly according to claim 2, wherein the respective distribution gradients are characterized with an increased distribution of the first nanocomposite formulation remote from a tip of the unitary radome layer with the ogive shape and an increased distribution of the second nanocomposite formulation proximate to the tip of the unitary radome layer with the ogive shape.

4. The unitary radome layer assembly according to claim 2, wherein:
    the first nanocomposite formulation comprises particles of first sizes,
    the second nanocomposite formulation comprises particles of second sizes, the second sizes being larger than the first sizes, and
    the respective distribution gradients are characterized with an increased distribution of the particles of the first sizes remote from a tip of the unitary radome layer with the ogive shape and an increased distribution of the particles of the second sizes proximate to the tip of the unitary radome layer with the ogive shape.

5. The unitary radome layer assembly according to claim 1, wherein the unitary radome layer has at least one of an ogive shape, a rounded shape and a flattened shape.

6. The unitary radome layer assembly according to claim 1, further comprising an electro-magnetic interference (EMI) treatment layer.

7. A radome assembly, comprising:
    a unitary radome layer having a nose cone shape with an aft portion, a tip and a curvature extending from the aft portion to the tip with an aft facing interior side and a forward facing exterior side,
    the unitary radome layer comprising:
    a first nanocomposite formulation with a first distribution gradient in the unitary radome layer which is characterized with an increased distribution of the first nanocomposite formulation toward the aft portion and the aft facing interior side of the curvature; and
    a second nanocomposite formulation with a second distribution gradient in the unitary radome layer which is characterized with an increased distribution of the second nanocomposite formulation toward the tip and the forward facing exterior side of the curvature.

8. The radome assembly according to claim 7, wherein the first nanocomposite formulation comprises yttrium oxide and the second nanocomposite formulation comprises magnesium oxide.

9. The radome assembly according to claim 7, wherein the first nanocomposite formulation comprises particles of a first size and the second nanocomposite formulation comprises particles of a second size larger than the first size.

* * * * *